(12) United States Patent
Ishikuri (10) Patent No.: US 6,674,681 B2
(45) Date of Patent: Jan. 6, 2004

(54) SEMICONDUCTOR INTEGRATED CIRCUIT (75) Inventor: Hitoshi Ishikuri, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/189,261

(22) Filed: Jul. 3, 2002

(65) Prior Publication Data
US 2003/0007409 A1 Jan. 9, 2003

(30) Foreign Application Priority Data
Jul. 6, 2001 (JP) ........................................ 2001-207025

(51) Int. Cl.[7] ................................................ G11C 7/00
(52) U.S. Cl. ........................................ 365/226; 365/228
(58) Field of Search ................................ 365/226, 228, 365/229, 185.04

(56) References Cited
U.S. PATENT DOCUMENTS
5,349,669 A * 9/1994 Arai et al. .................. 365/226
6,084,813 A * 7/2000 Kikuchi et al. ............. 365/228

* cited by examiner

Primary Examiner—Tan T. Nguyen
(74) Attorney, Agent, or Firm—Darryl G. Walker; Bradley T. Sako (57) ABSTRACT A semiconductor integrated circuit (100) that may determine whether or not a power supply voltage has dropped to a level that data integrity in a RAM portion (15) may be lost has been disclosed. Semiconductor integrated circuit (100) may include a power on clear (POC) circuit (1), a low voltage detecting circuit (2), a RAM data destruction preventing block (3), a RAM portion (15), and a combination circuit (4). POC circuit (1) may detect when a power supply potential is below a predetermined voltage and provide a reset signal to RAM data destruction preventing block (3). RAM data destruction preventing block (3) may prevent access to memory cells (20) in RAM portion (15) in response to the reset signal. Low voltage detecting circuit (2) may determine if the power supply potential may have dropped below a data holding voltage. In this way, data may only be rewritten to RAM portion (15) after a reset operation if data integrity may be lost.

20 Claims, 4 Drawing Sheets

SEMICONDUCTOR INTEGRATED CIRCUIT

TECHNICAL FIELD

The present invention relates generally to a semiconductor integrated circuit including a power on clear (POC) circuit and more particularly to a semiconductor integrated circuit including a circuit that may prevent data destruction in a random access memory (RAM) caused by a reset operation or the like.

BACKGROUND OF THE INVENTION

Semiconductor integrated circuits can include a power on clear (POC) circuit. A POC circuit is intended to detect a power up and set circuitry to a known state as necessary to ensure proper operation. Cases in which a POC circuit has been included on a semiconductor integrated circuit include a semiconductor integrated circuit in a remote control, a battery driven microcomputer, or the like.

A remote control including a POC circuit includes a ROM (read only memory) that stores data that can be used to configure the remote control waveform for a number of respective manufacturers and/or devices. This data is provided in a remote control so that a single remote control can have the capability of operating various devices and/or similar devices made by differing manufacturers. A remote control also includes a RAM (random access memory). The RAM is used to store data set by a user.

Figure 4:
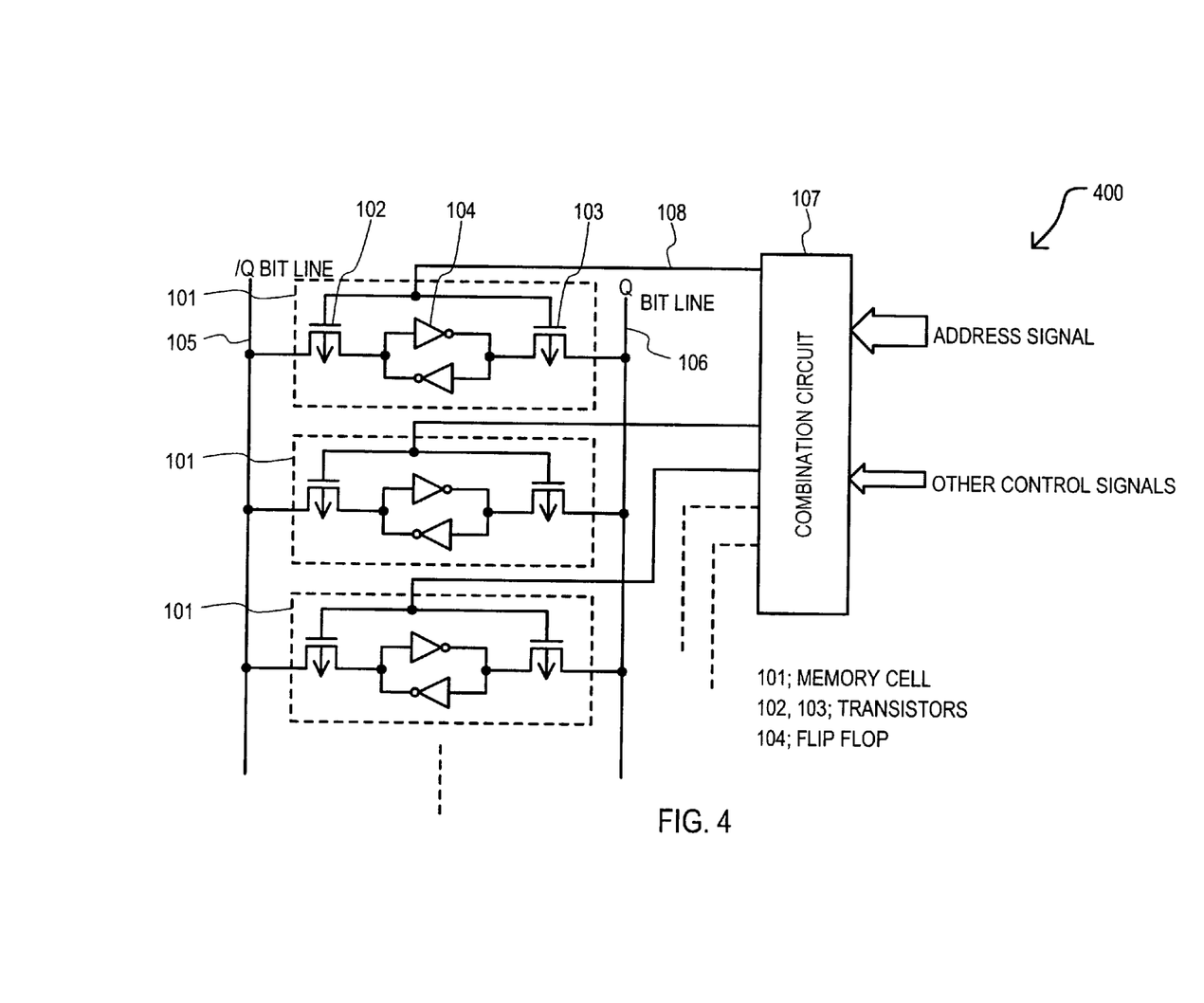
FIG. 4 is a circuit schematic diagram of a conventional semiconductor integrated circuit.

Referring now to FIG. 4, a circuit schematic diagram of a conventional semiconductor integrated circuit is set forth and given the general reference character 400. Conventional integrated circuit 400 is a portion of a remote control including a RAM.

RAM memory cells 101 include transistors (102 and 103) and flip-flops 104. Transistors (102 and 103) form transfer gates for each RAM memory cell 101. Transistors (102 and 103) have control gates commonly connected to a word line 108. Transistor 102 has a source/drain connected to bit line (/Q) 105 and another source/drain connected to a first node of flip-flop 104. Transistor 103 has a source/drain connected to bit line (Q) 106 and another source/drain connected to a second node of flip-flop 104. Flip-flop 104 includes a first and second inverter, with the first inverter having an output connected to the input of the second inverter at the first node and the second inverter having an output connected to an input of the first inverter at the second node.

RAM memory cells 101 are static random access memory (SRAM) cells.

A combination circuit 107 receives an address signal and other control signals and activates a respective word line 108. In this way, a respective memory cell 101 is selected.

In the conventional remote control including a RAM, as illustrated in conventional semiconductor integrated circuit 400, a POC circuit can be installed in the semiconductor integrated circuit 400 or attached externally to the semiconductor integrated circuit 400.

In a conventional remote control, when a reset is initiated by a POC circuit, the conventional remote control initializes the RAM data.

However, if a reset is initialized by a POC circuit, the data in the RAM can still be held unless a power supply voltage drops lower than a RAM holding voltage. A RAM holding voltage is a minimum voltage at which the RAM can reliably hold data in the memory cells. In this case, the integrity of the RAM data could still be reliable.

However, even if the RAM data is being held, the integrity of the data can be compromised when the POC circuit is asynchronously affected (for example, by a power supply fluctuation, or the like).

In other words, when reset by a POC circuit, for example, at the time RAM data is being accessed, word lines other than word lines for the access data may also become enabled (activated to select a memory cell) due to transitions of the address signal due to the reset. In this way, transistors (102 and 103) for memory cells not intentionally accessed can be turned on. This can lead to destruction of the RAM data, by for example, overwriting data in a memory cell with data on the bit lines (105 and 106). When a reset operation as described above, destroys data in the RAM, undesirable effects can occur.

In view of the above discussion, it would be desirable to provide a semiconductor integrated circuit that may prevent the destruction of RAM data due to a reset that may occur when operating conditions may allow data to be reliably held.

SUMMARY OF THE INVENTION

According to the present embodiments, a semiconductor integrated circuit that may determine whether or not a power supply voltage has dropped to a level that data integrity in a RAM portion may be lost. The semiconductor integrated circuit may include a POC circuit, a low voltage detecting circuit, a RAM data destruction preventing block, a RAM portion, and a combination circuit. A power on clear (POC) circuit may detect when a power supply potential is below a predetermined voltage and provide a reset signal to a RAM data destruction preventing block. A RAM data destruction preventing block may prevent access to memory cells in the RAM portion in response to the reset signal. A low voltage detecting circuit may determine if the power supply potential may have dropped below a data holding voltage. In this way, data may only be rewritten to a RAM portion after a reset operation if data integrity may be lost According to one aspect of the embodiments, a semiconductor integrated circuit may include a random access memory (RAM), a power on clear circuit, a first circuit, a second circuit, and a third circuit. RAM may include a plurality of word lines. A power on clear circuit may provide a reset signal. A first circuit may receive the reset signal and render the plurality of word lines in a non-select state when the reset signal is in a reset state. A second circuit may receive the reset signal and provide a system reset signal after a predetermined delay. A third circuit may determine whether or not a power supply potential has dropped below a low voltage detection potential. When the reset signal is in the reset state, a system may be reset after the plurality of word lines are in the non-select state.

According to another aspect of the embodiments, the third circuit may include a comparator. The comparator may compare the power supply potential with the low voltage detection potential and provide a low voltage detection flag.

According to another aspect of the embodiments, the third circuit may include a first RAM memory cell having a first transfer gate. The RAM may include a second RAM memory cell having a second transfer gate. A threshold voltage of the first transfer gate may be higher than a threshold voltage of the second transfer gate.

According to another aspect of the embodiments, the first circuit may receive an external reset signal and an address value. The first circuit may render the plurality of word lines in the non-select state when the external reset signal is in an external reset state. The first circuit may render at least one word line to a select state in response to the address value when the external reset signal is in an external non-reset state and the reset signal is in a non-reset state.

According to another aspect of the embodiments, the first circuit may include a first logic circuit and a second logic circuit. The first logic circuit may receive the external reset signal and the reset signal and provide an internal reset signal. The second logic circuit may receive the internal reset signal and the address value and provide the state of at least one word line.

According to another aspect of the embodiments, the first circuit may receive an external reset signal and a control signal. The first circuit may render the plurality of word lines in the non-select state when the external reset signal is in an external reset state.

According to another aspect of the embodiments, a semiconductor integrated circuit may include a random access memory (RAM), a first voltage level detection circuit, a first circuit, and a second voltage detection circuit. A RAM may include a plurality of memory cell selection signals. A first voltage level detection circuit may provide a first voltage level detection signal having a first voltage level logic level when a power supply potential is greater than a first detection potential and a second voltage level logic level when the power supply potential is less than the first detection potential. A first circuit may receive the first voltage level detection signal and provide the plurality of memory cell selection signals in a memory cell unselected state when the first voltage level detection signal has the second voltage level logic level. A second voltage detection circuit may detect when a power supply potential is less than a second detection potential and provide a low voltage level indicator. The second detection potential may be lower than the first detection potential.

According to another aspect of the embodiments, a semiconductor integrated circuit may provide the low voltage level indicator to a processor. The processor may rewrite data to the RAM after the low voltage level indicator is provided.

According to another aspect of the embodiments, the semiconductor integrated circuit may provide the first voltage level detection signal to a processor and the RAM may have the data rewritten when the first voltage level detection signal has the first voltage logic level after the low voltage level indicator is provided.

According to another aspect of the embodiments, the low voltage level indicator may be latched in a register and sampled in response to the first voltage level detection signal having the first voltage logic level.

According to another aspect of the embodiments, a delay circuit may receive the first voltage level detection signal and provide a system reset signal after a predetermined delay.

According to another aspect of the embodiments, the first circuit may receive an address value and activate one of the selection signal in accordance with the address value when the first voltage level detection signal has the first voltage level logic level.

According to another aspect of the embodiments, the second voltage level indicating circuit may include a comparator. The comparator may receive the power supply voltage at one compare input terminal and a reference potential at another compare input terminal and provide the low voltage level indicator.

According to another aspect of the embodiments, a semiconductor integrated circuit may include a random access memory (RAM), a first voltage level detection circuit, a first circuit, and a second voltage detection circuit. A RAM may receive at least one control signal. A first voltage level detection circuit may provide a first voltage level detection signal having a first voltage level logic level when a power supply potential is greater than a first detection potential and a second voltage level logic level when the power supply potential is less than the first detection potential. A first circuit may receive the first voltage level detection signal and provide the at least one control signal in a RAM unselected state when the first voltage level detection signal has the second voltage level logic level. A second detection circuit may detect when a power supply potential is less than a second detection potential and provide a low voltage level indicator. The second detection potential may be lower than the first detection potential.

According to another aspect of the embodiments, the second voltage level indicating circuit may include a comparator. The comparator may receive the power supply voltage at one compare input terminal and a reference potential at another compare input terminal and provide the low voltage level indicator.

According to another aspect of the embodiments, the second voltage level indicating circuit may include a first RAM memory cell having a first transfer gate. The RAM may include a second RAM memory cell having a second transfer gate. A threshold voltage of the first transfer gate may be higher than a threshold voltage of the second transfer gate.

According to another aspect of the embodiments, the first circuit may receive an external reset signal and provide the at least one control signal in the RAM unselected state when the external reset signal has an external reset logic level.

According to another aspect of the embodiments, the low voltage level indicator may be stored in a low voltage indicator register.

According to another aspect of the embodiments, a processor may sample the low voltage indicator register in response to the first voltage level detection signal having the first voltage level logic level.

According to another aspect of the embodiments, a processor may rewrite data in the RAM when the first voltage indicator register stores the low voltage level indicator and the first voltage level detection signal has the first voltage level logic level.

DETAILED DESCRIPTION OF THE EMBODIMENTS

Various embodiments of the present invention will now be described in detail with reference to a number of drawings.

Figure 1:
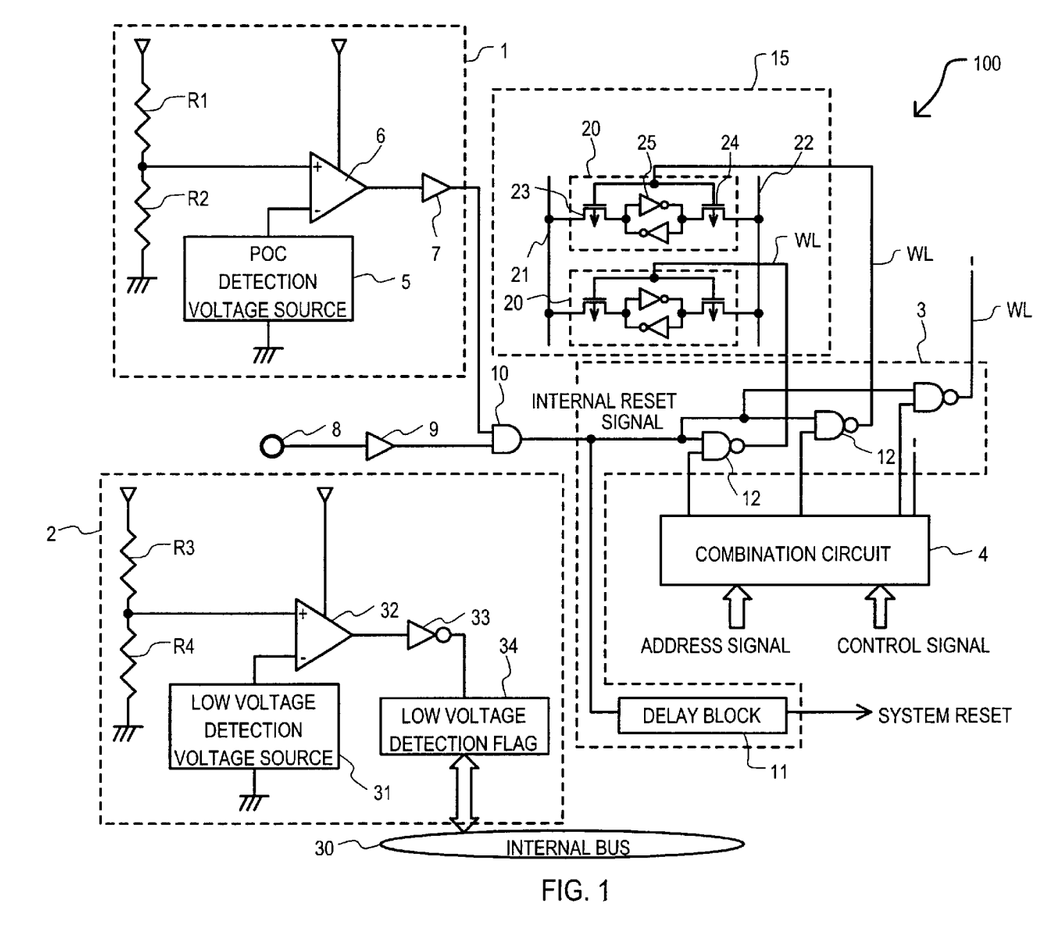
FIG. 1 is a circuit schematic diagram of a semiconductor integrated circuit according to an embodiment.

Referring to FIG. 1, a circuit schematic diagram of a semiconductor integrated circuit according to an embodiment is set forth and given the general reference character 100.

Semiconductor integrated circuit 100 may include a power on clear (POC) circuit 1, a low voltage detecting circuit portion 2, a RAM (random access memory) portion 15, a RAM data destruction preventing block 3, a combination circuit 4, an external reset terminal 8, a buffer 9, and an AND gate 10. POC circuit 1 may be included on semiconductor integrated circuit 100 or may be provided external to semiconductor integrated circuit 100.

POC circuit 1 may receive a power supply voltage and provide a POC output signal as an input to AND gate 10. AND gate 10 may receive a signal applied to an external reset terminal (through buffer 9) at another input. AND gate 10 may provide an internal reset signal as an output. Combination circuit 4 may receive an address signal and control signal and may provide a selection signals to RAM data destruction preventing block 3. RAM data destruction preventing block 3 may also receive internal reset signal and may provide word line signals at outputs onto word lines WL. Low voltage detection circuit 2 may receive a power supply voltage and provide a low voltage detection flag 34 to an internal bus 30.

RAM portion 15 may include memory cells 20. Each memory cell 20 may include transistors (23 and 24) and a flip-flop 25. Flip-flop 25 may be made up of two inverters, each having a respective input terminal connected to an output terminal of the other inverter. Transistor 23 may have one source/drain connected to bit line 21 and another source/drain connected to a first storage node of flip-flop 25. Transistor 24 may have one source/drain connected to bit line 22 and another source/drain connected to a second storage node of flip-flop 25. Bit lines (21 and 22) may form a complementary pair of bit lines such that one may transmit data and the other may transmit complementary data. Transistors (23 and 24) may each have a gate commonly connected to a word line WL, which may be provided by RAM data destruction preventing block. Transistors (23 and 24) may form transfer gates for a memory cell 20. Transistors (23 and 24) may be p-type insulated gate field effect transistors (IGFETs) and more particularly may be p-type metal oxide semiconductor field effect transistors (MOSFETs). Memory cells (20) may be static random access (SRAM) memory cells, as just one example.

POC circuit 1 may provide a POC output signal to an input of AND gate 10. POC circuit 1 may include resistors (R1 and R2), a POC detection voltage source 5, a comparator 6 and a buffer 7. Resistor R1 may be connected between a power supply voltage and a positive input terminal to comparator 6. Resistor R2 may be connected between a ground and a positive terminal of comparator 6. In this way, resistors (R1 and R2) may form a voltage divider that may provide a voltage to a positive terminal of comparator 6 that may be directly proportional the power supply voltage. POC detection voltage source 5 may be connected to a negative terminal of comparator 6. Comparator 6 may provide an output to an input of buffer 7. Buffer 7 may provide the POC circuit output signal.

POC circuit 1 may be provided to conduct a system reset when a power supply voltage of semiconductor integrated circuit 100 drops below a voltage level in which correct operation may be ensured. In this way, POC circuit 1 may prevent erroneous operations due to runaway of a system, or the like. POC detection voltage source 5 may be proportional to a voltage level in which correct operation of semiconductor integrated circuit 100 may be assured. In this way, when an input provided to a positive terminal of comparator 6 from a voltage divider (resistors R1 and R2) falls below POC detection voltage source 5, comparator 6 may provide a low output to buffer 7. Buffer 7 may provide a POC circuit output signal having a low logic level. In this way, AND gate 10 may provide an internal reset signal having a low logic level.

On the other hand, external reset terminal 8 may be provided with a low logic level when a reset is externally initiated. Buffer 9 may provide a low logic level as an input to AND gate 10. In this way, AND gate 10 may provide an internal reset signal having a low logic level.

The internal reset signal may be provided to RAM data destruction preventing block 3. RAM data destruction preventing block 3 may include a delay block 11 and NAND gates 12. Delay block 11 may receive internal reset signal and provide a system reset signal. Delay block 11 may provide a system reset signal to initiate a CPU reset operation, or the like, after word lines WL in RAM portion 15 have been disabled. After internal reset signal having a low logic level passes through delay block 11, a system reset signal may be provided. In this way, a system reset signal may be provided to a CPU (central processing unit), or the like, as a system reset signal that may initiate a reset operation of the CPU, or the like, after a delay time provided by delay block 11.

Internal reset signal may be provided to NAND gates 12. Each NAND gate 12 may also receive a respective selection signal from combination circuit 4. When internal reset signal 10 is at a low logic level, NAND gates 12 may be disabled and provide word lines WL having a high voltage. In this way, transistors (23 and 24) may be turned off and all memory cells 20 may be in an unselected state.

Combination circuit 4 provides a respective selection signal as an input to each NAND gate 12. A predetermined selection signal may become logic high (active) when address signal has a predetermined value. Thus, when internal reset signal is high (indicating no reset operation), a respective word line WL may be activated (low) corresponding to an activated (high) selection signal. In this way, respective transistors (23 and 24) for a memory cell 20 may be turned on and a memory cell 20 may thus be selected. However, other selection signals (than the active selection signal) may remain inactive (low) and corresponding word lines WL may remain inactive (high). In this way, respective transistors (23 and 24) for other memory cells 20 may remain turned off and other memory cells 20 may thus remain unselected.

Low voltage detecting circuit 2 may provide a low voltage detection flag 34 to an internal bus 30. Low voltage detecting circuit 2 may include resistors (R3 and R4), a low voltage detection voltage source 31, a comparator 32 and an inverter 33. Resistor R3 may be connected between a power supply voltage and a positive input terminal to comparator 32. Resistor R4 may be connected between a ground and a positive terminal of comparator 32. In this way, resistors (R3 and R4) may form a voltage divider that may provide a voltage to a positive terminal of comparator 32 that may be directly proportional the power supply voltage. Low voltage detection voltage source 31 may be connected to a negative terminal of comparator 32. Comparator 32 may provide an output to an input of inverter 33. Inverter 33 may provide the low voltage detection flag 34.

When an input provided to a positive terminal of comparator 32 from a voltage divider (resistors R3 and R4) falls below low voltage detection voltage source 31, comparator 32 may provide a low output to inverter 33. Inverter 33 may provide a low voltage detection flag 34 having a high logic level, which may be supplied to internal bus 30. On the other hand, when an input provided to a positive terminal of comparator 32 from a voltage divider (resistors R3 and R4) is above low voltage detection voltage source 31, comparator 32 may provide a high output to inverter 33. Inverter 33 may provide a low voltage detection flag 34 having a low logic level, which may be supplied to internal bus 30.

Low voltage detection flag 34 may indicate whether the power supply voltage is below a voltage level at which data may be reliably stored (held) in memory cells 20 in RAM portion 15. For example, when a battery in a remote control is being changed, or a voltage of a battery drops below a voltage in which memory cells 20 may reliably store data, low voltage detection flag 34 may output having a high logic level. Low voltage detection voltage source 31 may be provided to have a voltage so that low voltage detection flag 34 become high when a power supply voltage is still slightly above a voltage in which memory cells 20 may reliably store data. In this way, a slight design margin can be built in.

Low voltage detection flag 34 may become logic high when a power supply is initially turned on and has not yet reached a sufficient voltage or when a power supply has a decreased voltage (a dip). When low voltage detection flag 34 becomes logic high, a RAM portion 15 may be initialized through software. In this case, after low voltage detection flag 34 becomes low (the power supply has a sufficient voltage to allow memory cells 20 to store data) and RAM portion 15 has been initialized, data may be written to RAM portion 15.

Low voltage detection flag 34 may be stored in a register. When low voltage detection flag 34 becomes logic high, this register may hold the logic high value until an initialization of RAM portion 15 occurs. After initialization, a register storing low voltage detection flag 34 may be reset to a logic zero. An initialization may be performed through software, which may be stored in a read only memory (ROM) in a general personal computer, or the like. Also, reading and resetting (writing) of a register storing low voltage detection flag 34 may be controlled in accordance with a control signal output from a control means (not shown).

Figure 2:
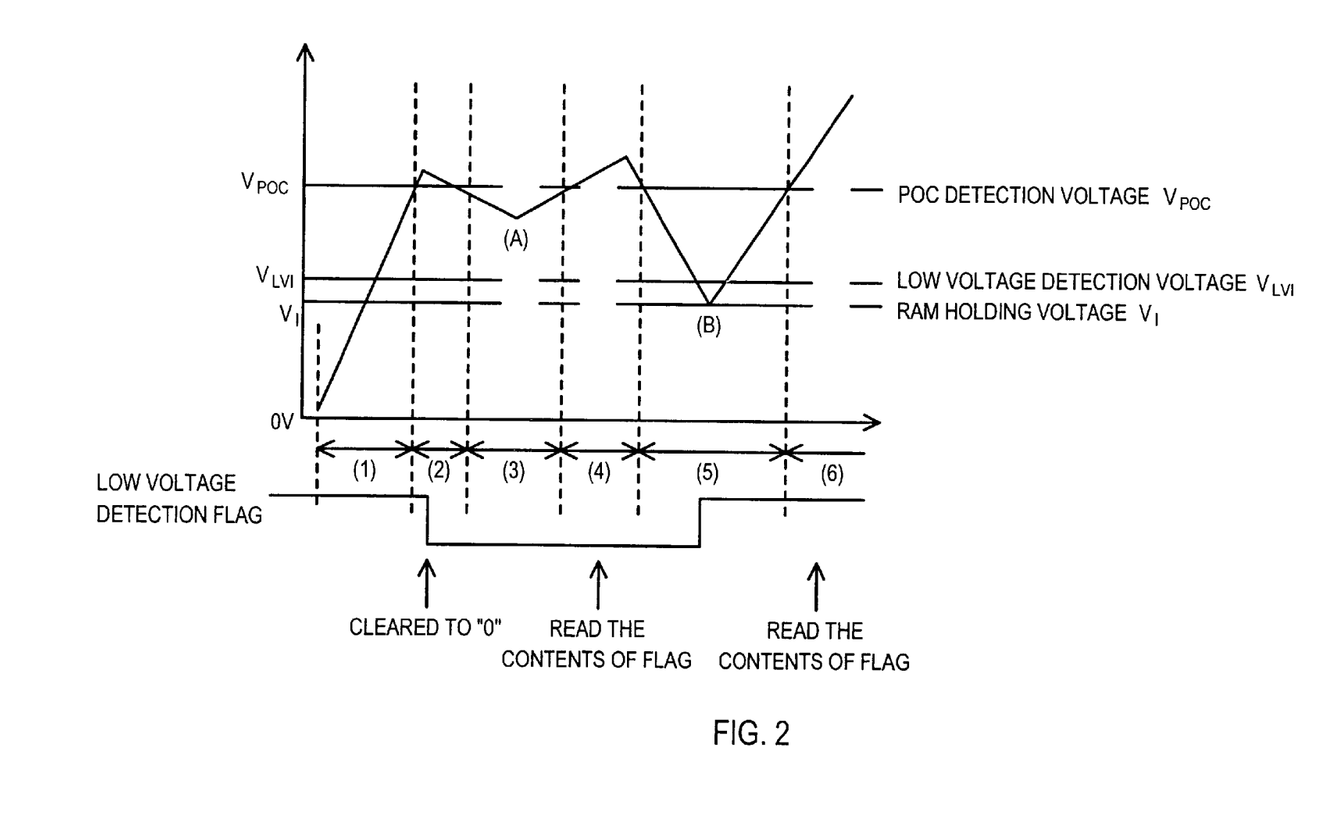
FIG. 2 is a graph illustrating a relationship between a power supply voltage, a power on clear (POC) detection voltage, and a low voltage detection flag according to an embodiment.

FIG. 2 is a graph illustrating a relationship between a power supply voltage, a POC detection voltage, and a low voltage detection flag according to an embodiment. The operation of semiconductor integrated circuit 100 will now be described with reference to FIG. 2 in conjunction with FIG. 1.

In the graph of FIG. 2, a solid line denotes the power supply, with the vertical axis indicating voltage and the horizontal axis indicating time. $V_{POC}$ indicates a voltage level at which the power supply voltage can provide a voltage level equal to POC detection voltage source 5 as an input to a positive terminal of comparator 6. $V_{LVI}$ indicates a voltage level at which the power supply voltage can provide a voltage level equal to low voltage detection voltage source 31 as an input to a positive terminal of comparator 32. $V_I$ indicates a lowest voltage level at which the power supply voltage is at a level in which data may be reliably stored (held) in memory cells 20 in RAM portion 15.

First, when the power supply voltage rises, for example by replacing a battery such as a dry cell battery or the like, an initialization may be performed in period (1) in FIG. 2. Also, because the power supply voltage is rising from a level below a low voltage detection voltage $V_{LVI}$, low voltage detection flag 34 may be a high logic level.

Then, in period (2), the power supply voltage may exceed $V_{POC}$ and initialization may be completed. In this way, low voltage detection flag 34 may be reset to a low logic level by, for example, clearing a register. Data may also be written into memory cells 20 in RAM portion 15.

In period (3), the power supply voltage may drop below $V_{POC}$. Thus, internal reset signal may become low. In this way, NAND gates 12 in RAM data destruction prevention block 3 may be disabled and word line WL may be high. Thus, memory cells 20 may all be in an unselected state and data may be undisturbed. Because the minimum power supply voltage (point (A) in period (3)) remains above $V_{LVI}$, low voltage detection flag 34 may remain at a low logic level and data in memory cells 20 may remain intact.

Next, in period (4), the power supply voltage rises and again becomes higher than $V_{POC}$. Thus, internal reset signal returns to a high logic level and NAND gates 12 in RAM data destruction prevention block 2 may be enabled. Also, system reset signal may return to a high logic level, thus indicating to the system that a reset has been terminated. In response to the termination of the reset, the value of low voltage detection flag 34 may be sampled (for example software may read a register value, or the like). Because low voltage detection flag 34 is at a low logic level at this time, a determination is made that data in RAM portion 15 may not be corrupted due to an insufficient power supply voltage. In this way, it may not be necessary to initialize RAM portion 15 to rewrite the data, for example.

Next, in a period (5), the power supply voltage drops below $V_{POC}$. Thus, internal reset signal may become low. In this way, NAND gates 12 in RAM data destruction prevention block 3 may be disabled and word line WL may be high. Thus, memory cells 20 may all be in an unselected state. However, the lowest potential (point (B)) is lower than $V_{LVI}$, low voltage detection flag 34 may become logic high. When the power supply voltage rises and again becomes higher than $V_{POC}$, internal reset signal returns to a high logic level and NAND gates 12 in RAM data destruction prevention block 2 may be enabled. Also, system reset signal may return to a high logic level, thus indicating to the system that a reset has been terminated. In response to the termination of the reset, the value of low voltage detection flag 34 may be sampled (for example software may read a register value, or the like). Because low voltage detection flag 34 is at a high logic level at this time, a determination is made that data in RAM portion 15 may be corrupted due to an insufficient power supply voltage. In this way, it may be necessary to initialize RAM portion 15 to rewrite the data in memory cells 20, for example.

Next, in a period (6), the power supply voltage becomes higher than $V_{POC}$, returns to a high logic level and NAND gates 12 in RAM data destruction prevention block 3 may be enabled. In response to the termination of the reset, the value of low voltage detection flag 34 may be sampled (for example software may read a register value, or the like). Because low voltage detection flag 34 is at a high logic level at this time, a determination is made, that data in RAM portion 15 may be corrupted due to an insufficient power supply voltage. In this way, it may be necessary to initialize RAM portion 15 to rewrite the data in memory cells 20, for example. The determination and the initialization of RAM portion 15 may be performed in response to software commands executed by a processor, or the like, for example.

In the above embodiment, when an external reset signal is received or POC circuit 1 determines that a power supply voltage drops below a predetermined potential, an internal reset signal may be provided from AND circuit 10. In this way, all the word lines WL to memory cells 20 may be in a disabled state. Then, after internal reset signal has been delayed through delay block 11, the system, such as a CPU, may be reset (initiated by system reset signal).

In conventional semiconductor integrated circuit 400 illustrated in FIG. 4, in a case where a reset is initiated by a POC circuit in an asynchronous manner or by a reset signal applied to an external terminal, a word line WL may be activated by combination circuit 107. Thus, a memory cell 101 may be selected in accordance with a state of an address on an address bus at the time of the reset. In some cases, a word line WL of a memory cell 101, which is not intended to be accessed, may become selected due to transitions on an address bus at the time of the reset. This may cause data in the selected memory cell 101 to become overwritten and thus corrupted.

However, according to the embodiments, an internal reset signal may disable word lines WL of all memory cells 20. After a predetermined delay period, a system, such as the CPU or the like may be reset. In this way, corruption or destruction of data stored in a RAM portion 15 may be prevented, even in a case of an asynchronous reset.

Low voltage detecting circuit 2 may monitor whether or not the power supply voltage drops to a low voltage detection potential or lower. If the power supply voltage drops below a low voltage detection potential, a low voltage detection flag 34 may be set to a high logic level. When the power supply rises above a predetermined potential, the low voltage detection flag 34 may be read by, for example, a control unit. A determination may then be made as to whether or not data stored in a RAM portion 15 may be disrupted during a reset. In this way, a user of a semiconductor integrated circuit 100 may determine whether or not the power supply voltage has dropped below a voltage in which a RAM portion 15 may reliably hold data. By preventing memory cells 20 from being accessed during a reset (for example, a reset caused by a POC circuit 1, or the like), data integrity may remain as long as the power supply voltage has not dropped below a voltage in which RAM portion 15 can reliably hold data. Because the voltage in which RAM portion 15 can reliably hold data is generally lower than a POC detection voltage, data in a RAM portion 15 may remain intact during the reset operation unless the power supply drops below the voltage in which RAM portion 15 can reliably hold data.

Figure 3:
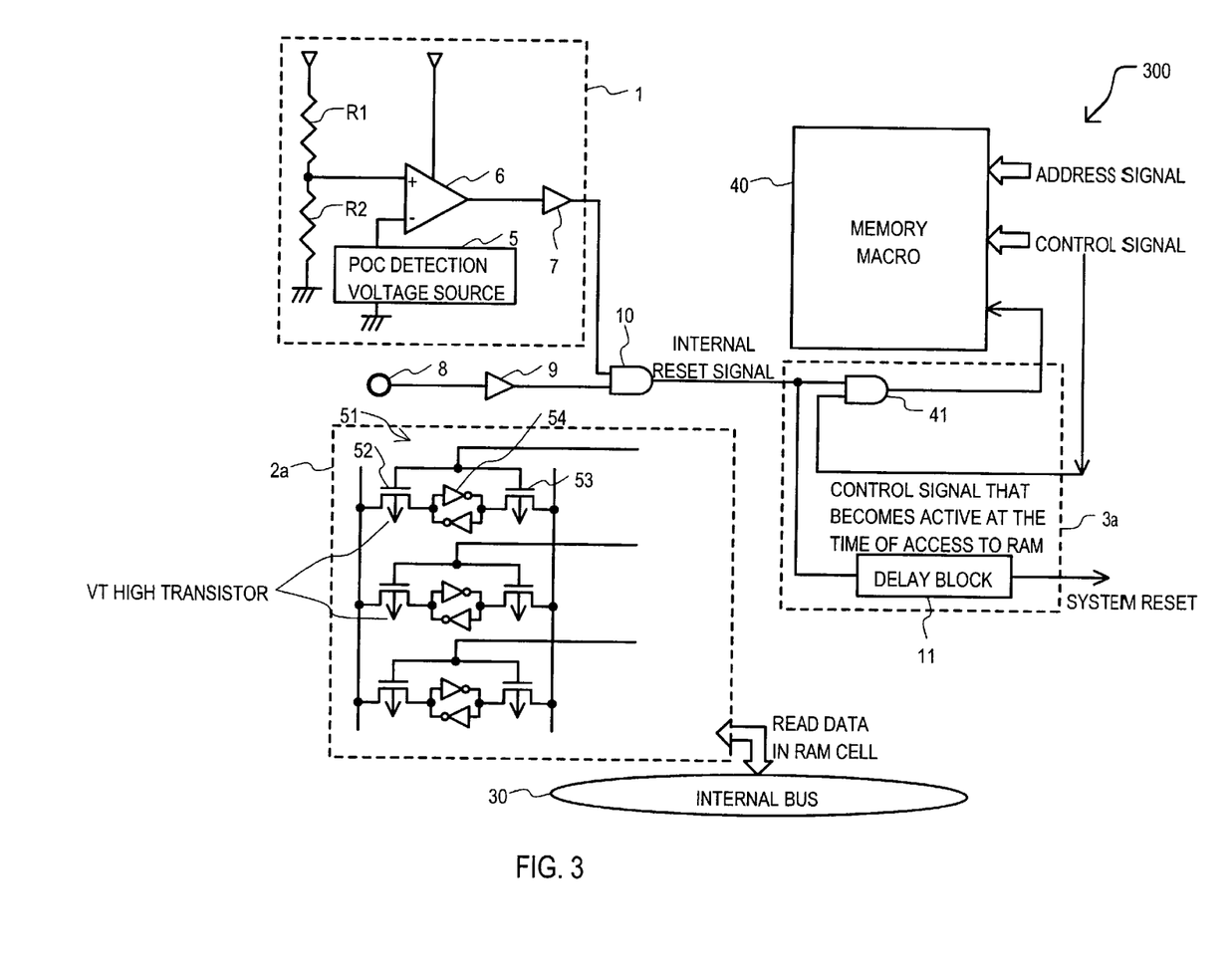
FIG. 3 is a circuit schematic diagram of a semiconductor integrated circuit according to an embodiment.

Another embodiment of the present invention will now be discussed with reference to FIG. 3. Referring to FIG. 3, a circuit schematic diagram of a semiconductor integrated circuit according to an embodiment is set forth and given the general reference character 300. Semiconductor integrated circuit 300 may include similar constituents as semiconductor integrated circuit 100 and such constituents may have the same reference character and their description may be omitted.

Semiconductor integrated circuit 300 of FIG. 3 may differ from semiconductor integrated circuit 100 of FIG. 1 in that semiconductor integrated circuit 300 may include a low voltage detecting circuit 2a, a RAM data destruction preventing block 3a, and a memory macro 40 in addition to POC circuit 1, buffer 9, and AND gate 10. Memory macro 40 may include a RAM.

Memory macro 40 may receive an address signal and a control signal. RAM data destruction preventing block 3a may receive the control signal. The control signal may become logic high at a time of an access to a RAM in memory macro 40. RAM data destruction preventing block 3a may include a delay block 11 and AND gate 41. AND gate 41 may receive an internal reset signal and the control signal as inputs and provide an output as an input to memory macro 40. When a reset is executed (internal reset signal is logic low), AND gate 41 may provide a logic low output as an input to memory macro 40. In this way, memory macro 40 may not be accessed and memory macro 40 may be disabled. However, when internal reset is logic high (indicating no reset operation), AND gate 41 may provide an output as an input to memory macro 40 having the same logic level as the control signal. In this way, the control signal may initiate an access to memory macro 40 when at a logic high level.

Low voltage detecting circuit 2a may include memory cells 51. Each memory cell 51 may have a diminished data holding characteristics as compared to a normal memory cell (for example, a memory cell in memory macro 40). A memory cell 51 may lose data integrity at a higher power supply voltage than a normal memory cell would lose data integrity. Memory cell 51 may include transistors (52 and 53) having a threshold voltage $V_T$ that may be higher than a normal threshold voltage. Transistors (52 and 53) may respectively connect data storing nodes of a flip-flop 54 to a respective bit line. A memory cell 51 in low voltage detecting circuit 2a may be selected to have data read from or written to by way of an internal bus 30.

In semiconductor integrated circuit 300, even if the control signal becomes active (logic high) at a time internal reset signal becomes logic low (indicating a reset operation), RAM data destruction preventing block 3a may provide an output as an input to memory macro 40 having a disable state. In this way, access to memory macro 40 may be prevented. However, if internal reset signal is logic high (indicating no reset operation), when control signal becomes active, RAM destruction preventing block 3a may provide an output as an input to memory macro 40 having an enable state. In this way, access to memory macro 40 may be allowed.

Thus, when memory macro 40 is accessed, even if a reset signal occurs, the destruction of data in memory macro 40 may be prevented. As such, even if a RAM is included as a macro, a RAM activation signal may be combined with an internal reset signal to prevent data and data destruction caused by a reset operation at a time of access to the RAM may be prevented.

Also, low voltage detecting circuit 2a may include a low voltage detection memory cell 51, which may have lower holding characteristics than a normal memory cell (such as a memory cell in a RAM in a memory macro 40). In this way, memory cells 51 in low voltage detecting circuit 2a may be read in a determination step to determine whether or not a supply potential has dropped below a low voltage detection potential. If data in memory cells 51 remains intact, it may be determined that data integrity in memory macro 40 remains. However, if data in memory cells does not remain intact, it may be determined that data integrity in memory macro 40 may not remain and an initialization step may be performed to rewrite data in memory macro 40.

Similarly, in this embodiment, the destruction of RAM data when a reset operation is performed may be prevented in a case where a potential of a power supply voltage does not drop below a low voltage detection potential. Thus, an unnecessary step of rewriting data to a RAM may be prevented.

As described above, according to the embodiments, even if a reset operation is executed while accessing a RAM, the destruction of data in the RAM may be prevented. The reset operation may be executed in response to a POC circuit or a reset signal applied at an external terminal. Also, during a reset operation, a low voltage detecting circuit may recognize whether the power supply voltage has dropped to a RAM holding voltage or lower. When the power supply voltage has not dropped to a RAM holding voltage, it may be determined that the integrity of data in the RAM may be intact. However, when the power supply voltage has dropped to a RAM holding voltage, it may be determined that the integrity of data in the RAM may not be intact. In this way, after the reset has been terminated, a determination may be made whether the power supply voltage dropped below the RAM holding voltage during the reset. If the power supply voltage did drop below the RAM holding voltage during the reset, an initialization step where data is rewritten into the RAM may be performed. However, if the power supply voltage did not drop below the RAM holding voltage during the reset, an initialization step where data is rewritten into the RAM may not be performed.

It is understood that the embodiments described above are exemplary and the present invention should not be limited to those embodiments. Specific structures should not be limited to the described embodiments.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor integrated circuit, comprising:
   a random access memory (RAM) having a plurality of word lines;
   a power on clear circuit that provides a reset signal;
   a first circuit coupled to receive the reset signal and render the plurality of word lines in a non-select state when the reset signal is in a reset state;
   a second circuit coupled to receive the reset signal and provide a system reset signal after a predetermined delay; and
   a third circuit that determines whether or not a power supply potential has dropped below a low voltage detection potential, wherein when the reset signal is in the reset state a system is reset after the plurality of word lines are in the non-select state.

2. The semiconductor integrated circuit according to claim 1, wherein:
   the third circuit includes a comparator that compares the power supply potential with the low voltage detection potential and provide a low voltage detection flag.

3. The semiconductor integrated circuit according to claim 1, wherein:
   the third circuit includes a first RAM memory cell having a first transfer gate;
   the RAM includes a second RAM memory cell having a second transfer gate wherein a threshold voltage of the first transfer gate is higher than a threshold voltage of the second transfer gate.

4. The semiconductor integrated circuit according to claim 1, wherein:
   the first circuit is coupled to receive an external reset signal and an address value and render the plurality of word lines in the non-select state when the external reset signal is in an external reset state and render at least one word line to a select state in response to the address value when the external reset signal is in an external non-reset state and the reset signal is in a non-reset state.

5. The semiconductor integrated circuit according to claim 4, wherein:
   the first circuit includes
   a first logic circuit coupled to receive the external reset signal and the reset signal and provide an internal reset signal; and
   a second logic circuit coupled to receive the internal reset signal and the address value and provide the state of at least one word line.

6. The semiconductor integrated circuit according to claim 1, wherein:
   the first circuit is coupled to receive an external reset signal and a control signal and render the plurality of word lines in the non-select state when the external reset signal is in an external reset state.

7. A semiconductor integrated circuit, comprising:
   a random access memory (RAM) including a plurality of memory cell selection signals;
   a first voltage level detection circuit that provides a first voltage level detection signal having a first voltage level logic level when a power supply potential is greater than a first detection potential and a second voltage level logic level when the power supply potential is less than the first detection potential;
   a first circuit coupled to receive the first voltage level detection signal and provide the plurality of memory cell selection signals in a memory cell unselected state when the first voltage level detection signal has the second voltage level logic level; and
   a second voltage detection circuit that detects when a power supply potential is less than a second detection potential lower than the first detection potential and provide a low voltage level indicator.

8. The semiconductor integrated circuit according to claim 7, wherein:
   the semiconductor integrated circuit is coupled to provide the low voltage level indicator to a processor that rewrites data to the RAM after the low voltage level indicator is provided.

9. The semiconductor integrated circuit according to claim 8, wherein:
   the semiconductor integrated circuit is coupled to provide the first voltage level detection signal to the processor and the RAM has the data rewritten when the first voltage level detection signal has the first voltage level logic level after the low voltage level indicator is provided.

10. The semiconductor integrated circuit according to claim 7, further including:
    a register that latches the low voltage level indicator.

11. The semiconductor integrated circuit according to claim 7, further including:
    a delay circuit coupled to receive the first voltage level detection signal and provide a system reset signal after a predetermined delay.

12. The semiconductor integrated circuit according to claim 7, wherein:
    the first circuit is coupled to receive an address value and activate one of the selection signals in accordance with the address value when the first voltage level detection signal has the first voltage level logic level.

13. The semiconductor integrated circuit according to claim 7, wherein:

the second voltage level indicating circuit includes a comparator coupled to receive the power supply voltage at one compare input terminal and a reference potential at another compare input terminal and provide the low voltage level indicator.

14. A semiconductor integrated circuit, comprising:

a random access memory (RAM) coupled to receive at least one control signal;

a first voltage level detection circuit that provides a first voltage level detection signal having a first voltage level logic level when a power supply potential is greater than a first detection potential and a second voltage level logic level when the power supply potential is less than the first detection potential;

a first circuit coupled to receive the first voltage level detection signal and provide the at least one control signal in a RAM unselected state when the first voltage level detection signal has the second voltage level logic level; and a second voltage detection circuit coupled to detect when a power supply potential is less than a second detection potential lower than the first detection potential and provide a low voltage level indicator.

15. The semiconductor integrated circuit, according to claim 14, wherein:

the second voltage level indicating circuit includes a comparator coupled to receive the power supply voltage at one compare input terminal and a reference potential at another compare input terminal and provide the low voltage level indicator.

16. The semiconductor integrated circuit according to claim 14, wherein:

the second voltage level indicating circuit includes a first RAM memory cell having a first transfer gate; and the RAM includes a second RAM memory cell having a second transfer gate wherein a threshold voltage of the first transfer gate is higher than a threshold voltage of the second transfer gate.

17. The semiconductor integrated circuit according to claim 14, wherein:

the first circuit is coupled to receive an external reset signal and provide the at least one control signal in the RAM unselected state when the external reset signal has an external reset logic level.

18. The semiconductor integrated circuit according to claim 14, further including:

a low voltage indicator register that stores the low voltage level indicator.

19. The semiconductor integrated circuit according to claim 18, wherein:

the semiconductor integrated circuit is coupled to a processor that samples the low voltage indicator register in response to the first voltage level detection signal having the first voltage level logic level.

20. The semiconductor integrated circuit according to claim 18, wherein:

the semiconductor integrated circuit is coupled to a processor that rewrites data in the RAM when the low voltage indicator register stores the low voltage level indicator and the first voltage level detection signal has the first voltage level logic level.

* * * * *